(12) United States Patent
Naser

(10) Patent No.: US 11,682,553 B2
(45) Date of Patent: Jun. 20, 2023

(54) METHOD OF MANUFACTURING AN ELECTRONIC DEVICE

(71) Applicant: COMMISSARIAT A L'ENERGIE ATOMIQUE ET AUX ENERGIES ALTERNATIVES, Paris (FR)

(72) Inventor: Hasan Naser, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 263 days.

(21) Appl. No.: 17/061,744

(22) Filed: Oct. 2, 2020

(65) Prior Publication Data

US 2021/0143006 A1 May 13, 2021

(30) Foreign Application Priority Data

Oct. 4, 2019 (FR) ..................................... 19 10990

(51) Int. Cl.
*H01L 21/02* (2006.01)
*H01L 23/00* (2006.01)
*H01L 29/16* (2006.01)

(52) U.S. Cl.
CPC ........ *H01L 21/02167* (2013.01); *H01L 24/27* (2013.01); *H01L 24/29* (2013.01);
(Continued)

(58) Field of Classification Search
CPC ..... H01L 24/27; H01L 29/1608; H01L 24/83; H01L 24/29; H01L 21/02002;
(Continued)

(56) References Cited

U.S. PATENT DOCUMENTS 7,208,392 B1 4/2007 Jaussaud et al.
8,373,175 B1 2/2013 Okojie
(Continued)

FOREIGN PATENT DOCUMENTS

EP 3 229 260 A1 10/2017

OTHER PUBLICATIONS

French Preliminary Search Report dated Jun. 19, 2020 in French Application 19 10990 filed on Oct. 4, 2019 (with English Translation of Categories of Cited Documents & Written Opinion), 11 pages.
(Continued)

*Primary Examiner* — Mouloucoulaye Inoussa
(74) *Attorney, Agent, or Firm* — Oblon, McClelland, Maier & Neustadt, L.L.P.

(57) ABSTRACT

There is provided a method for manufacturing an electronic device including a substrate of semiconductor material, an intermediate portion, and a silicon carbide layer, the method including transferring the silicon carbide layer from a first electronic element onto a face of a second electronic element including the substrate, the transfer including: providing the first element including a primary silicon carbide-based layer, a first diffusion barrier portion, and a first metal layer; providing the second element including the substrate, a second diffusion barrier portion, and a second metal layer; and bonding an exposed face of each of the first and the second metal layers, the first and the second metal layers being formed of tungsten, the first and the second portions being formed of at least one tungsten silicide layer, and the second portion, the second metal layer, the first metal layer, and the first portion form the intermediate portion.

14 Claims, 2 Drawing Sheets

(52) U.S. Cl.
CPC .......... *H01L 24/83* (2013.01); *H01L 29/1608* (2013.01); *H01L 2224/29684* (2013.01); *H01L 2224/83895* (2013.01); *H01L 2924/01074* (2013.01)

(58) Field of Classification Search
CPC ............. H01L 21/02167; H01L 21/185; H01L 21/0485; H01L 23/53295; H01L 21/76832; H01L 23/53238; H01L 21/187; H01L 25/50; H01L 21/76834; H01L 21/76871; H01L 24/09; H01L 21/76807; H01L 24/03; H01L 25/0652; H01L 21/8684; H01L 23/481; H01L 25/105; H01L 24/08; H01L 24/80; H01L 23/293; H01L 23/5385; H01L 24/06; H01L 21/76883; H01L 24/89; H01L 23/3192; H01L 23/538; H01L 25/0657; H01L 25/043; H01L 23/291; H01L 24/10; H01L 21/76805; H01L 24/02; H01L 21/76898; H01L 21/76897; H01L 24/94; H01L 21/78; H01L 24/81; H01L 2224/83895; H01L 2224/29684; H01L 2924/01074; H01L 2224/48227; H01L 2224/80896; H01L 2224/08145; H01L 2224/80099; H01L 2224/04105; H01L 23/3735; H01L 2224/80013; H01L 2225/1058; H01L 2224/02372; H01L 2225/0651; H01L 2224/05624; H01L 33/0093; H01L 2225/06513; H01L 2224/80895; H01L 2224/05647; H01L 2924/01029; H01L 2224/05684; H01L 2924/00014; H01L 2924/01322; H01L 2224/00571; H01L 2224/05547; H01L 2224/80855; H01L 2224/80986; H01L 2224/05138; H01L 2224/94; H01L 2224/13147; H01L 2224/131; H01L 2224/29339; H01L 2224/8123; H01L 2224/81203; H01L 2224/0557; H01L 2224/056; H01L 2224/81815; H01L 2224/05181; H01L 2224/8023; H01L 2224/05666; H01L 2224/73251; H01L 2224/04042; H01L 2224/05166; H01L 2224/0401

USPC ... 257/737, 770, 774, 686, E23.06, E21.499, 257/E21.705, E23.145, E23.163; 438/107, 109, 455, 584, 108, 637, 675, 438/458

See application file for complete search history.

(56) References Cited

U.S. PATENT DOCUMENTS

| | | | | |
|---|---|---|---|---|
| 8,431,436 | B1* | 4/2013 | Nguyen | H01L 25/0657 438/455 |
| 9,754,922 | B2* | 9/2017 | Smeys | H01L 24/94 |
| 10,157,867 | B1* | 12/2018 | Chen | H01L 23/5385 |
| 2009/0057890 | A1* | 3/2009 | Maebashi | H01L 24/12 257/E23.06 |
| 2010/0029058 | A1* | 2/2010 | Shimomura | H01L 21/2007 257/E21.568 |
| 2011/0101445 | A1 | 5/2011 | Kim et al. | |
| 2011/0248403 | A1* | 10/2011 | Chandrasekaran | H01L 24/94 257/E21.705 |
| 2012/0013013 | A1* | 1/2012 | Sadaka | H01L 24/80 257/773 |
| 2015/0021785 | A1* | 1/2015 | Lin | H01L 24/89 438/459 |
| 2016/0013160 | A1* | 1/2016 | Chun | H01L 25/50 257/751 |
| 2016/0155665 | A1* | 6/2016 | Kuang | H01L 21/76883 438/618 |
| 2016/0160374 | A1* | 6/2016 | Antolino | C04B 41/52 428/448 |
| 2017/0330747 | A1 | 11/2017 | Akiyama | |
| 2018/0005977 | A1* | 1/2018 | Lin | H01L 24/02 |
| 2018/0033773 | A1* | 2/2018 | Huang | H01L 25/0657 |
| 2019/0035681 | A1* | 1/2019 | Kuang | H01L 23/293 |
| 2019/0092632 | A1* | 3/2019 | Louwers | B81C 1/00595 |
| 2020/0105600 | A1* | 4/2020 | Lu | H01L 24/94 |
| 2021/0057363 | A1* | 2/2021 | Chen | H01L 23/53295 |

OTHER PUBLICATIONS

Reader et al., "Transition metal silicides in silicon technology", Rep. Prog. Phys. 56, Jul. 1993, 72 pages.

Delacruz et al., "TiN diffusion barrier for stable W/SiC(0001) interfaces in inert ambient at high temperature", Thin Solid Films 670, 2019, pp. 54-59.

* cited by examiner

METHOD OF MANUFACTURING AN ELECTRONIC DEVICE

TECHNICAL FIELD

The present invention relates to the field of electronics in general and microelectronic devices. It finds a particularly advantageous application in the field of power transistors, this example not being limiting. Any application implementing silicon carbide and requiring vertical electrical conductivity is open to the invention.

In general, the invention can be used in all microelectronic devices.

PRIOR ART

In the case of power transistors operating vertically (that is to say according to the thickness dimension of the substrates), a bonding of semiconductor materials with a buried conductive layer is of major interest for microelectronic applications. In order to achieve this assembly, a technical solution is the placement of thin films of monocrystalline silicon carbide (SiC) onto a substrate, in particular made of polycrystalline silicon carbide, via an electrically conductive bonding.

It is in this context that the patent publication U.S. Pat. No. 7,208,392 B1 is inscribed which shows, in the case of FIGS. 6A to 6D, among various embodiments, obtaining a placement of a thin film made of silicon carbide on a more massive substrate, also made of silicon carbide. An implementation of metal layers, made of titanium, achieves a bonding during a placement of layers. According to this document, a cleavage technique at a weakened area allows only the thin silicon carbide film to remain on the final device.

The technical constraints of this method for placing silicon carbide layers with bonding are nevertheless very severe. In particular, generally, it will be necessary for the bonding to be stable under conditions of epitaxy of the silicon carbide of the order of 1700° C. and during the various steps of the method, for example the cleavage of the thin film, typically between 800° C. and 900° C. It is therefore necessary to have a bonding ensuring the lowest possible electrical resistivity while being compatible with the formation conditions of silicon carbide layers (epitaxy, cleavage). In this context, the current technique reveals limitations, in particular through the formation of chemical phases degrading the functionality of the desired structure: liquid phase, parasitic solid phase, cavities, etc.

It should also be specified that a method for manufacturing an electronic device by stacking comprising a substrate made of a semiconductor material, an intermediate portion and a silicon carbide layer, exists, in particular within the patent application EP3229260A1. The method also describes a transfer of the silicon carbide layer from a first electronic element onto a face of a second electronic element comprising the substrate.

However, this method does not seem to allow to guarantee high thermodynamic stability, for example up to a temperature range of at least 1900° C.

An object of the present invention is therefore to provide a method and a resulting device which allow to obtain thermodynamically stable structures while having a satisfactory level of electrical (and possibly thermal) conductivity.

The other objects, features and advantages of the present invention will become apparent upon examining the following description and the accompanying drawings. It is understood that other advantages can be incorporated.

SUMMARY

To achieve this purpose, according to one embodiment, provision is made of a method for manufacturing an electronic device including in stack a substrate made of semiconductor material, an intermediate portion and a silicon carbide layer, the method comprising a transfer of the silicon carbide layer from a first electronic element onto a face of a second electronic element comprising the substrate, the transfer comprising:
  providing the first element comprising in stack a primary silicon carbide-based layer, a first diffusion barrier portion and a first metal layer;
  providing the second element comprising in stack the substrate, a second diffusion barrier portion and a second metal layer
  bonding an exposed face of the first metal layer and an exposed face of the second metal layer.
Advantageously:
  the first metal layer and the second metal layer are formed of tungsten;
  the first portion is formed of at least one tungsten silicide layer;
  the second portion is formed of at least one tungsten silicide layer,
  the second diffusion barrier portion, the second metal layer, the first metal layer and the first diffusion barrier portion forming the intermediate portion.

Thus, effective bonding is obtained with high electrical continuity between the substrate and the silicon carbide-based layer. This ensures a stable final stack even at high temperature with strong vertical electrical conductivity.

While the presence of tungsten silicide layer(s) could a priori have appeared to be unfavourable to the conductivity of the stack produced, relative to tungsten alone in particular, this controlled presence (these layers are intentionally manufactured, therefore in particular of reduced and adjustable thicknesses without technical difficulty) allows, contrary to this prejudice, to obtain a stable stack in terms of composition, because little or not sensitive to the diffusion of species during technological steps with a high thermal budget; all this while ensuring good vertical conductivity from an electrical point of view.

Advantageously, the stack is thermodynamically stable, that is to say that there is no significant chemical reactivity between the various layers during the various production steps.

Another aspect relates to an electronic device comprising in stack a substrate based on semiconductor material, an intermediate portion, and a silicon carbide-based layer, the intermediate portion successively comprising at least a first tungsten silicide layer, a tungsten layer and at least a second tungsten silicide layer.

Such a device provides a stack of layers favourable to subsequent technological steps, in particular when high temperatures are involved. The electrical conductivity through the stack is improved, in particular with respect to stacks without resorting to tungsten and to silicides of this metal.

Another aspect relates to an electronic element comprising in stack a silicon carbide layer, a diffusion barrier portion and a tungsten layer, the diffusion barrier portion successively comprising a $WSi_2$ layer and a $W_5Si_3$ layer.

This element has a succession of tungsten silicide layers selected in a precise manner to cooperate with the surrounding layers. Indeed, the layer made of $WSi_2$ forms a first barrier between the silicon carbide and the second silicide layer, made of $W_5Si_3$. The role of the latter is to separate the pure tungsten from the $WSi_2$ in order to prevent its decomposition. An advantageous aspect is the use of such an element, and preferably a system of a first and a second element, for the placement of a silicon carbide layer with a tungsten bonding layer.

Thus, unlike patent application EP3229260A1 and thanks to the portions of diffusion barriers, a high thermodynamic stability is guaranteed, for example but in a non-limiting manner, up to a temperature range of at least 1900° C., and possibly between 25° C. and 1900° C. Indeed, the existence of a diffusion barrier portion formed of at least one tungsten silicide layer between the first metal layer and the primary layer and of a diffusion barrier portion formed of at least one tungsten silicide layer between the second metal layer and the substrate contributes to the method allowing to obtain thermodynamically stable structures while having a satisfactory level of electrical conductivity.

BRIEF DESCRIPTION OF THE FIGURES

The purposes, objects, as well as the features and advantages of the invention will become more apparent from the detailed description of an embodiment of the latter which is illustrated by the following accompanying drawings wherein.

Figure 1:
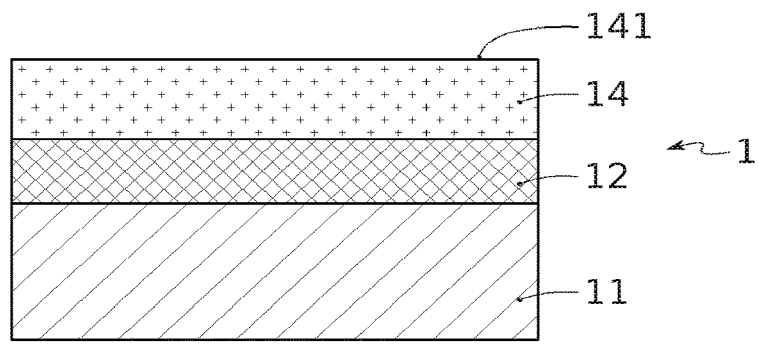
FIG. 1 shows a first embodiment of an electronic element.

The drawings are given by way of example and are not limiting of the invention. They constitute schematic principle representations intended to facilitate the understanding of the invention and are not necessarily on the scale of practical applications.

DETAILED DESCRIPTION

Before starting a detailed review of embodiments of the invention, optional features are listed below which can optionally be used in combination or alternatively:

at least one of the tungsten silicide layers is a layer of a material selected from $WSi_2$ and $W_5Si_3$;
the first portion is formed of at least one $W_5Si_3$ layer 12.
the $W_5Si_3$ layer 12 of the first portion is in contact with the first metal layer 14;
the first portion is also formed of a $WSi_2$ layer 13 between the primary layer 11 and the $W_5Si_3$ layer 12 of the first portion;
the second portion is formed of at least one $W_5Si_3$ layer 22.
the $W_5Si_3$ layer 22 of the second portion is in contact with the second metal layer 24;
the second portion is also formed of a $WSi_2$ layer 23 between the substrate 21 and the $W_5Si_3$ layer 22 of the second portion;
at least one tungsten silicide layer of at least one of the first portion and the second portion is selected with a thickness less than or equal to 20 nm and/or greater than or equal to 5 nm;
at least one tungsten silicide layer of at least one of the first portion and the second portion is formed by co-sputtering W molecules and Si molecules;
the bonding comprises direct bonding with surface activation;
the surface activation is configured to deoxidise, at least partially, the exposed face 141 of at least one of the first metal layer 14 and the second metal layer 24;
the substrate 21 is made of silicon carbide;
The method comprises the formation of a weakening area 111 in the primary layer by implantation of chemical species and, after bonding, a cleavage of the primary layer at the weakening area 111 by application of an annealing.

Advantageously, the substrate 21 is made of silicon carbide, which does not exclude other portions or layers, in particular made of other materials, from being attached to the lower face of said substrate.

Preferably, the first diffusion barrier portion and/or the second diffusion barrier portion is made only of the $WSi_2$ or $W_5Si_3$ layer, or the pair of layers respectively made of $WSi_2$ and $W_5Si_3$.

Preferably, at least one of the first portion and the second portion successively comprises, between a silicon carbide layer and a tungsten layer, a $WSi_2$ layer and a $W_5Si_3$ layer.

Preferably, the stacks do not comprise layers other than the tungsten silicide layers between the semiconductor substrate/silicon carbide primary layer, and the tungsten metal layers.

Advantageously, the primary layer is used to form the placed silicon carbide layer, with a separation of a portion of the primary layer, so as to place only one layer, thinner than the primary layer, on the electronic element that includes the substrate. However, it is not excluded that the entire primary layer forms the silicon carbide layer added after bonding. Likewise, it is not excluded that other layers are present on the first element, in particular on the face of the primary layer opposite the first metal layer.

Preferably, the silicon carbide layer is formed of monocrystalline silicon carbide.

It is specified that in the context of the present invention, the term "electrically conductive" means that the corresponding part, in particular a layer or a succession of layers, has a sufficient level of electrical conductivity to have an efficient electricity passage function in a given application. Advantageously, according to the invention, the entire first element and/or second element of the resulting device is electrically conductive. In particular, it is possible to produce satisfactory electrical conductivity between the material of the substrate and the silicon carbide layer.

It is specified that in the context of the present invention, the terms "on", "surmounts", "covers" or "underlying" or their equivalents do not necessarily mean "in contact with". Thus, for example, the deposition of a first layer on a second layer does not necessarily mean that the two layers are directly in contact with each other, but it does mean that the first layer at least partially covers the second layer by being either directly in contact therewith or by being separated therefrom by at least one other layer or at least one other element.

A layer can moreover be composed of several sub-layers made of the same material or of different materials.

A component, device or element of a microelectronic device means any type of element produced with the means of microelectronics. These devices encompass in particular, in addition to purely electronic devices, micromechanical or electromechanical devices (MEMS, NEMS, . . . ) as well as optical or optoelectronic devices (MOEMS, . . . ).

A thickness for a layer, a height for a device or an element will be considered. The thickness is taken in a direction normal to the main extension plane of the layer, just like the height.

To determine the disposition of the various layers, it is possible to carry out electron microscopy analyses, in particular Scanning Electron Microscopy (SEM) or Transmission Electron Microscopy (TEM).

The chemical compositions of the various layers or regions can be determined using the well-known EDX or X-EDS method, acronym for "energy dispersive x-ray spectroscopy" which stands for "energy dispersive analysis of X photons", or else by energy loss spectroscopy (known by the acronym EELS, and corresponding to "Electron Energy Loss Spectroscopy"), or else by the XRD method using X-ray refraction, the SIMS method of secondary ion mass spectrometry, or else the RBS method of Rutherford backscattering spectroscopy.

Figure 3A:
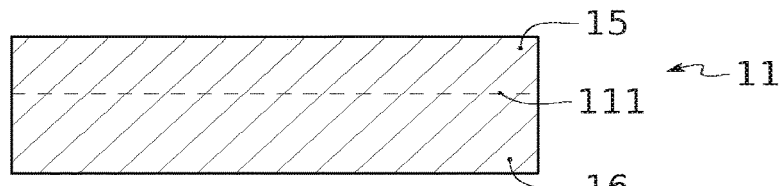
FIGS. 3A to 3D show an example of steps of implementing the method.
Figure 3B:
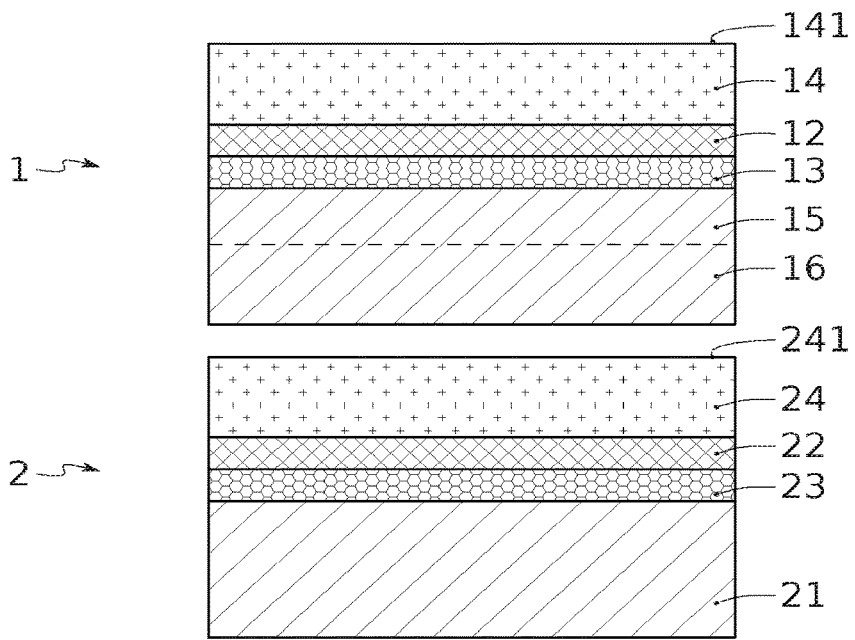
Figure 3C:
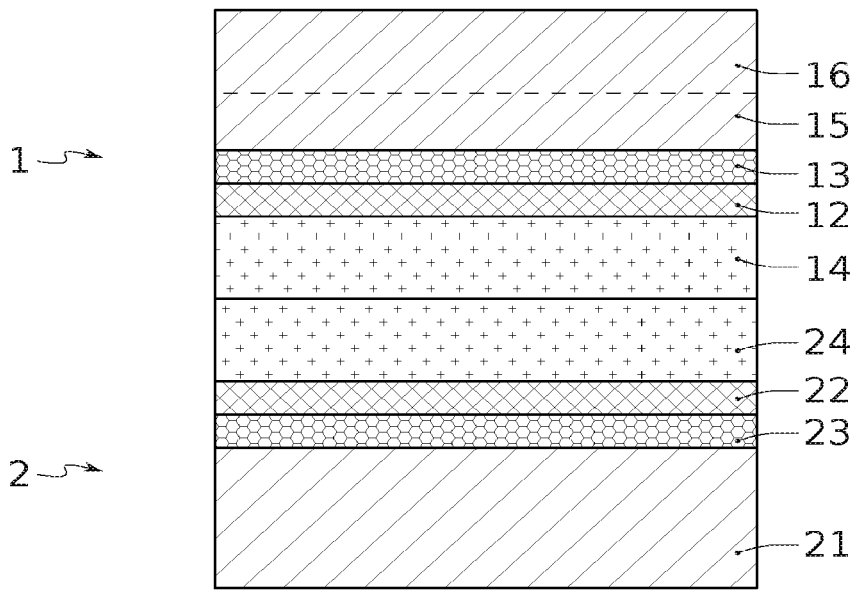
Figure 3D:
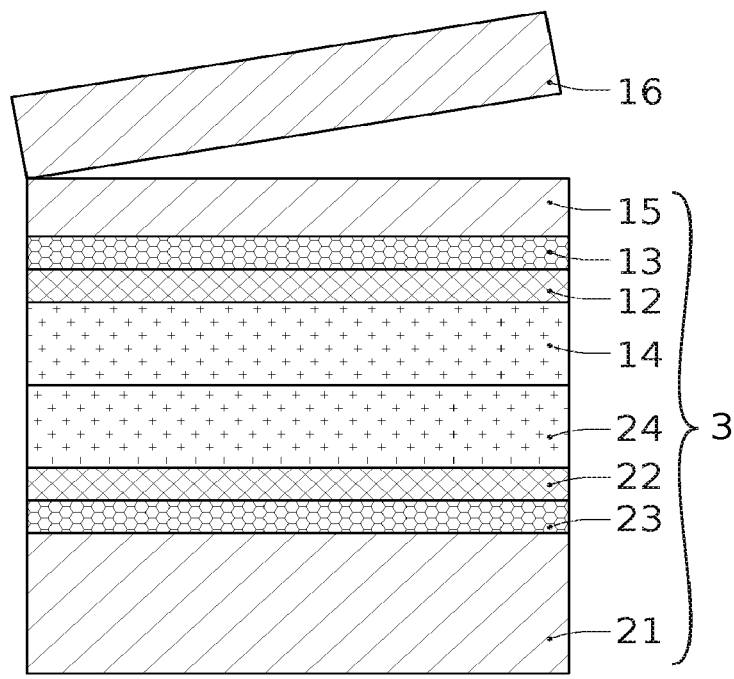

In general, the present invention seeks to provide an electronic device 3 including, for example, the structure revealed in FIG. 3D. The device 3 can optionally be the object of other transformations to constitute a final system, which means that other elements than the stacks described here can be added thereto.

A first part of the stack is a substrate 21. It will be a semiconductor material, and preferably silicon carbide, which is advantageously polycrystalline. However, it is also possible to use silicon, in particular polycrystalline silicon, provided that the thermal budget involved in the manufacture is lower than the melting temperature of the silicon, that is to say around 1400° C.; however, if a repeat of epitaxy is to be done, the thermal budget may be too high to select this material.

On a first face of the substrate 21, the stack of the device 3 includes an intermediate portion, the structure of which will be described in more detail below. Overall, it should be noted that it includes a buried metal layer made of tungsten.

The intermediate portion is covered, opposite the substrate 21, by a silicon carbide layer 15. Preferably, it is monocrystalline silicon carbide; it may be 4H—SiC.

Such a device 3 can be obtained by a method implementing a bonding between two elements 1, 2 each having a metal tungsten layer operating as a bonding interface.

In this context, FIG. 1 shows a first embodiment of a first element 1. This first element comprises a primary layer 11 intended to form the silicon carbide layer 15 of the resulting device. In a purely indicative manner, the thickness of the primary layer 11 may be greater than 300 microns and/or less than 400 microns, and in particular equal to 350 microns. The primary layer is surmounted with a tungsten silicide layer, $W_5Si_3$ in this case. Its thickness can be comprised between 5 nm and 20 nm. It can be obtained by deposition by sputtering, and in particular a co-sputtering of W and Si in suitable molar proportions. This technique has the advantage of avoiding a metal/silicon diffusion pair and silicidation by interdiffusion is avoided. Alternatively, a sputter of a mixture of W and Si is used.

This type of tungsten silicide can be preferred for high temperature stability.

Layer 14 of FIG. 1 is a layer of pure tungsten. In particular, the thickness of this layer may be at least 20 nm and/or at most 100 nm. It can be obtained by sputtering.

Alternatively, the tungsten silicide layer 12 is made of $WSi_2$. In this solution, the barrier layer thus produced is not in thermodynamic equilibrium with the pure tungsten. It can be anticipated that there will be formation of $W_5Si_3$ at the interface between the tungsten and the barrier layer starting at temperatures of the order of 800° C. However, even if such temperatures are reached, this formation can be tolerated, because the growth of this phase can be controlled so as to master its thickness.

Figure 2:
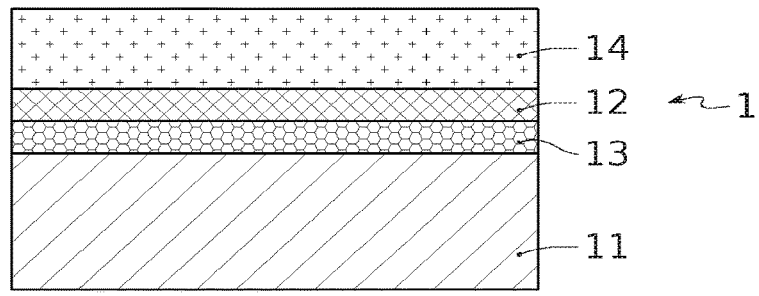
FIG. 2 shows a second embodiment of an electronic element.

Another embodiment of the first element 1 is shown in FIG. 2. The stack of this element then comprises an additional tungsten silicide layer, namely a $WSi_2$ layer which is interposed between the silicon carbide and the silicide layer which are previously described.

In terms of thickness and manufacturing conditions, the parameters of the $WSi_2$ layer may be equivalent to those given for the $W_5Si_3$ layer.

As regards the second electronic element 2, the production can follow one of the examples given above with reference to the first element 1. Simply, the base of the stack is then the substrate 21.

The following figures, from FIG. 3A to 3D, show potential successive steps for obtaining the device of the invention and implementing the method.

In FIG. 3A, the primary layer 11 of the first element 1 is subjected to ion implantation, for example until targeting an area at a depth of 300 nm relative to the surface of the primary layer. The portion where the implanted species concentrate forms a weakening area 111. It is understood that the depth of implantation will determine the thickness of the resulting silicon carbide layer. In general, it can be less than 500 nm, and for example comprised between 450 and 500 nanometres.

FIG. 3B illustrates the formation of the stacks of elements 1 and 2, which may adopt the examples described above.

The elements 1 and 2 are then assembled by contacting the exposed faces 141, 241 of the tungsten layer 14, 24, respectively, of the first element 1 and of the second element. A bonding using the technique of direct bonding is suitable. It is configured to be electrically conductive. A direct bonding with Surface Activated Bonding, known by the acronym SAB, can be implemented. According to this technique, a plasma, in particular argon plasma, is applied to the faces to be assembled.

Advantageously, this bonding allows to create an interatomic bond at room temperature and without adding adhesive material. Furthermore, the surface activation incidentally allows a deoxidation of surfaces 141, 241.

After bonding, the assembly can be annealed, for example at a temperature comprised between 800° and 900° C.; this annealing is advantageously configured to produce a cleavage of the weakening area 111. The separation created at this area is schematically shown in FIG. 3D with the release of the portion 16 of the primary layer. Preferably, but not necessarily, this heat treatment is also used for the formation of the tungsten silicide layer(s), also acting as annealing after sputtering, in particular in the case of an SiC/$WSi_2$/W stack. A complementary or alternative heat treatment just after co-sputtering is possible.

The rest of the stacks thus assembled advantageously remain in place to form the device 3. Thus, the latter therefore includes successively:

the substrate 21;
a $WSi_2$ layer 23;
a $W_5Si_3$ layer 22;
a global tungsten layer formed of the initial layers 14, 24;
a $W_5Si_3$ layer 12;
a $WSi_2$ layer 13;
the silicon carbide layer 15.

Thanks to the invention, it is possible to use devices based on silicon carbide, which are very advantageous considering their ability to work in extreme conditions of temperature and radiation, while having a high level of electrical conductivity.

The invention is not limited to the embodiments described above and extends to all of the embodiments covered by the claims.

The invention claimed is:

1. A method for manufacturing an electronic device including, in a stack, a substrate made of semiconductor material, an intermediate portion, and a silicon carbide layer, the method comprising:
    transferring the silicon carbide layer from a first electronic element onto a face of a second electronic element comprising the substrate, the transferring comprising:
        providing the first electronic element comprising, in the stack, a primary silicon carbide-based layer, a first diffusion barrier portion, and a first metal layer;
        providing the second electronic element comprising, in the stack, the substrate and a second metal layer; and
        bonding an exposed face of the first metal layer and an exposed face of the second metal layer,
    wherein the first metal layer and the second metal layer are formed of tungsten,
    wherein the first diffusion barrier portion is formed of a first tungsten silicide layer of $WSi_2$ and a second tungsten silicide layer of $W_5Si_3$,
    wherein the first tungsten silicide layer of $WSi_2$ is disposed between the primary silicon carbide-based layer and the second tungsten silicide layer of $W_5Si_3$,
    wherein the second tungsten silicide layer of $W_5Si_3$ is disposed between the first metal layer and the first tungsten silicide layer of $WSi_2$, and
    wherein the second metal layer, the first metal layer, and the first diffusion barrier portion form the intermediate portion.

2. The method according to claim 1,
    wherein the second electronic element further comprises, in the stack, a second diffusion barrier portion between the substrate and the second metal layer,
    wherein the second diffusion barrier portion is formed of another first tungsten silicide layer of $WSi_2$ and another second tungsten silicide layer of $W_5Si_3$, and
    wherein the intermediate portion further comprises the second diffusion barrier portion.

3. The method according to claim 2, wherein the another first tungsten silicide layer of $WSi_2$ is disposed between the substrate and the another second tungsten silicide layer of $W_5Si_3$.

4. The method according to claim 1, wherein the second tungsten silicide layer of $W_5Si_3$ of the first diffusion barrier portion is in contact with the first metal layer and with the first tungsten silicide layer of $WSi_2$.

5. The method according to claim 2, wherein the another second tungsten silicide layer of $W_5Si_1$ of the second diffusion barrier portion is in contact with the second metal layer and with the another first tungsten silicide layer of $WSi_2$.

6. The method according to claim 2, wherein at least one tungsten silicide layer of at least one of the first diffusion barrier portion and the second diffusion barrier portion is selected with a thickness less than or equal to 20 nm and/or greater than or equal to 5 nm.

7. The method according to claim 2, wherein at least one tungsten silicide layer of at least one of the first diffusion barrier portion and the second diffusion barrier portion is formed by co-sputtering W molecules and Si molecules.

8. The method according to claim 1, wherein the bonding comprises a direct bonding with surface activation.

9. The method according to claim 8, wherein the surface activation is configured to deoxidise, at least partially, the exposed face of at least one of the first metal layer and the second metal layer.

10. The method according to claim 1, wherein the substrate is made of silicon carbide.

11. The method according to claim 1, further comprising forming a weakening area in the primary silicon carbide-based layer by implantation of chemical species and, after bonding, cleaving the primary silicon carbide-based layer at the weakening area by application of an annealing.

12. An electronic device, comprising, in a stack:
    a substrate based on a semiconductor material;
    an intermediate portion; and
    a silicon carbide-based layer,
    the intermediate portion successively comprising at least a first tungsten silicide layer, a tungsten layer, and at least a second tungsten silicide layer,
    wherein the first tungsten silicide layer is formed of a first layer of $WSi_2$ and a second layer of $W_5Si_3$, and
    wherein the second tungsten silicide layer is formed of another first layer of $WSi_2$ and another second layer of $W_5Si_3$.

13. The device according to claim 12, wherein the first layer of $WSi_2$ is disposed between the silicon carbide-based layer and the second layer of $W_5Si_3$.

14. An electronic element comprising, in a stack:
    a silicon carbide layer;
    a diffusion barrier portion; and
    a tungsten layer,
    the diffusion barrier portion successively comprising a $WSi_2$ layer and a $W_5Si_3$ layer,
    wherein the $WSi_2$ layer is disposed between the silicon carbide layer and the $W_5Si_3$ layer, and
    wherein the $W_5Si_3$ layer is disposed between the tungsten layer and the $WSi_2$ layer.

* * * * *